un(12) United States Patent
Kellogg et al.

(10) Patent No.: US 8,975,817 B2
(45) Date of Patent: Mar. 10, 2015

(54) PRESSURE CONTROLLED HEAT PIPE TEMPERATURE CONTROL PLATE

(71) Applicant: Lam Research Corporation, Fremont, CA (US)

(72) Inventors: Michael C. Kellogg, Oakland, CA (US); Rajinder Dhindsa, San Jose, CA (US); Tom Stevenson, Morgan Hill, CA (US)

(73) Assignee: Lam Research Corporation, Fremont, CA (US)

( * ) Notice: Subject to any disclaimer, the term of this patent is extended or adjusted under 35 U.S.C. 154(b) by 3 days.

(21) Appl. No.: 13/653,923

(22) Filed: Oct. 17, 2012

(65) Prior Publication Data

US 2014/0103806 A1    Apr. 17, 2014

(51) Int. Cl.
*H01J 7/24* (2006.01)
*H01J 37/32* (2006.01)

(52) U.S. Cl.
CPC .............................. *H01J 37/32449* (2013.01)
USPC ............ 315/111.21; 315/111.51; 315/111.81; 315/111.41

(58) Field of Classification Search
USPC ........................................ 315/111.01–111.81
See application file for complete search history.

(56) References Cited

U.S. PATENT DOCUMENTS

| | | | | |
|---|---|---|---|---|
| 5,844,195 | A * | 12/1998 | Fairbairn et al. | 219/121.43 |
| 5,900,103 | A * | 5/1999 | Tomoyasu et al. | 156/345.44 |
| 6,073,577 | A * | 6/2000 | Lilleland et al. | 118/723 E |
| 6,391,147 | B2 * | 5/2002 | Imafuku et al. | 156/345.47 |
| 6,491,784 | B2 * | 12/2002 | Yamaguchi et al. | 156/345.34 |
| 6,716,302 | B2 * | 4/2004 | Carducci et al. | 156/345.47 |
| 7,531,061 | B2 * | 5/2009 | Long | 156/345.27 |
| 7,622,392 | B2 * | 11/2009 | Nishimura et al. | 438/706 |
| 7,834,554 | B2 * | 11/2010 | Horsky | 315/111.81 |
| 7,838,842 | B2 * | 11/2010 | Horsky | 250/423 R |
| 8,894,806 | B2 * | 11/2014 | Koshimizu et al. | 156/345.44 |
| 2002/0127853 | A1 * | 9/2002 | Hubacek et al. | 438/689 |
| 2004/0261946 | A1 * | 12/2004 | Endoh et al. | 156/345.15 |
| 2008/0237182 | A1 * | 10/2008 | Yamawaku et al. | 216/59 |
| 2013/0337654 | A1 * | 12/2013 | Patrick et al. | 438/715 |

\* cited by examiner

*Primary Examiner* — Douglas W Owens
*Assistant Examiner* — Srinivas Sathiraju
(74) *Attorney, Agent, or Firm* — Buchanan Ingersoll & Rooney PC

(57) ABSTRACT

A showerhead electrode assembly for a plasma processing chamber, which includes a showerhead electrode; a heater plate secured to the showerhead electrode; at least one pressure controlled heat pipe secured to an upper surface of the heater plate, the at least one pressure controlled heat pipe having a heat transfer liquid contained therein, and a pressurized gas, which produces a variable internal pressure within the at least one pressure controlled heat pipe; a top plate secured to an upper surface of the at least one heat pipe; and wherein the variable internal pressure within the at least one pressure controlled heat pipe during heating of the showerhead electrode by the heater plate displaces the heat transfer liquid from a thermal path between the top plate and the heater plate, and when removing excess heat from the showerhead electrode returns the heat transfer liquid to the thermal path.

20 Claims, 4 Drawing Sheets

PRESSURE CONTROLLED HEAT PIPE TEMPERATURE CONTROL PLATE

BACKGROUND

In the field of semiconductor material processing, semiconductor material processing apparatuses including vacuum processing chambers are used for performing various plasma processes, such as etching of materials on substrates. The effectiveness of these etch processes is often dependent on the ability to control the temperature conditions at certain locations of the processing chambers.

Current temperature control consists of a cooled top plate and heated thermal control plate. The heater or heating elements within the thermal control plate is used to preheat the silicon upper electrode (or showerhead electrode) prior to processing. During processing plasma will heat the electrode to a steady state temperature based on the process power and thermal choke configuration. The heater is used to preheat the electrode prior to plasma processing. Preheating the electrode increases etch uniformity by limiting the chamber variables during processing. Without preheating the polymer deposition in the chamber would change until the electrode reaches steady state temperature.

With the current trend to use higher and higher process powers, it would be desirable to have a temperature control plate, which creates a variable conductance heat choke to the top plate.

SUMMARY

In accordance with an exemplary embodiment, a showerhead electrode assembly for a plasma processing chamber, comprises: a showerhead electrode; a heater plate secured to an upper surface of the showerhead electrode; at least one pressure controlled heat pipe secured to an upper surface of the heater plate, the at least one pressure controlled heat pipe having a heat transfer liquid contained therein, and a pressurized gas, which produces a variable internal pressure within the at least one pressure controlled heat pipe; a top plate secured to an upper surface of the at least one heat pipe; a plurality of vertical gas passages in the showerhead electrode, the heater plate, and the top plate for delivering a plasma processing gas to the plasma processing chamber located beneath a lower surface of the showerhead electrode; and wherein the variable internal pressure within the at least one pressure controlled heat pipe during heating of the showerhead electrode by the heater plate displaces the heat transfer liquid from a thermal path between the top plate and the heater plate, and when removing excess heat from the showerhead electrode returns the heat transfer liquid to the thermal path.

In accordance with another exemplary embodiment, a method of controlling the temperature of a top electrode of a showerhead electrode assembly in a plasma processing chamber containing a substrate support having a bottom electrode, the method comprising: generating plasma in the plasma processing chamber in a gap between the top electrode and the substrate support; applying power from at least one power supply to at least one heater of a heater plate of the showerhead electrode assembly to heat the top electrode; supplying a temperature-controlled liquid from at least one liquid source to liquid channels of a cooling plate of the showerhead assembly to control the temperature of the cooling plate; and controlling heat conduction between the cooling plate and the top plate by creating a variable conductance heat choke between the cooling plate and the heater plate by placing at least one pressure controlled heat pipe between the cooling plate and heater plate to thereby maintain the top electrode at a desired temperature, the at least one pressure controlled heat pipe having a heat transfer liquid contained therein, and a pressurized gas, which produces a variable internal pressure within the at least one pressure controlled heat pipe.

The details of one or more embodiments of the disclosure are set forth in the accompanying figures and the description below. Other features, objects, and advantages will be apparent from the description and figures, and from the claims.

BRIEF DESCRIPTION OF THE DRAWINGS

The accompanying figures are included to provide a further understanding of the invention, and are incorporated in and constitute a part of this specification. The figures illustrate embodiments of the invention and, together with the description, serve to explain the principles of the invention.

DETAILED DESCRIPTION

In processing semiconductor substrates, control over plasma parameters, such as plasma chemistry, ion energy, density, and distribution, electron temperature, etc., is desired to alter plasma processing results. In addition to these plasma parameter controls, temperatures of surfaces in a plasma chamber, which confine the plasma, may also be used to control plasma chemistry and hence, the processing results of a semiconductor substrate such as a wafer. Accordingly, it would be desirable to include a temperature control module or plate, which can be thermally isolated from selected portions of the showerhead electrode assemblies, and have desirably fast response times, to allow reliable and responsive temperature control.

Figure 1:
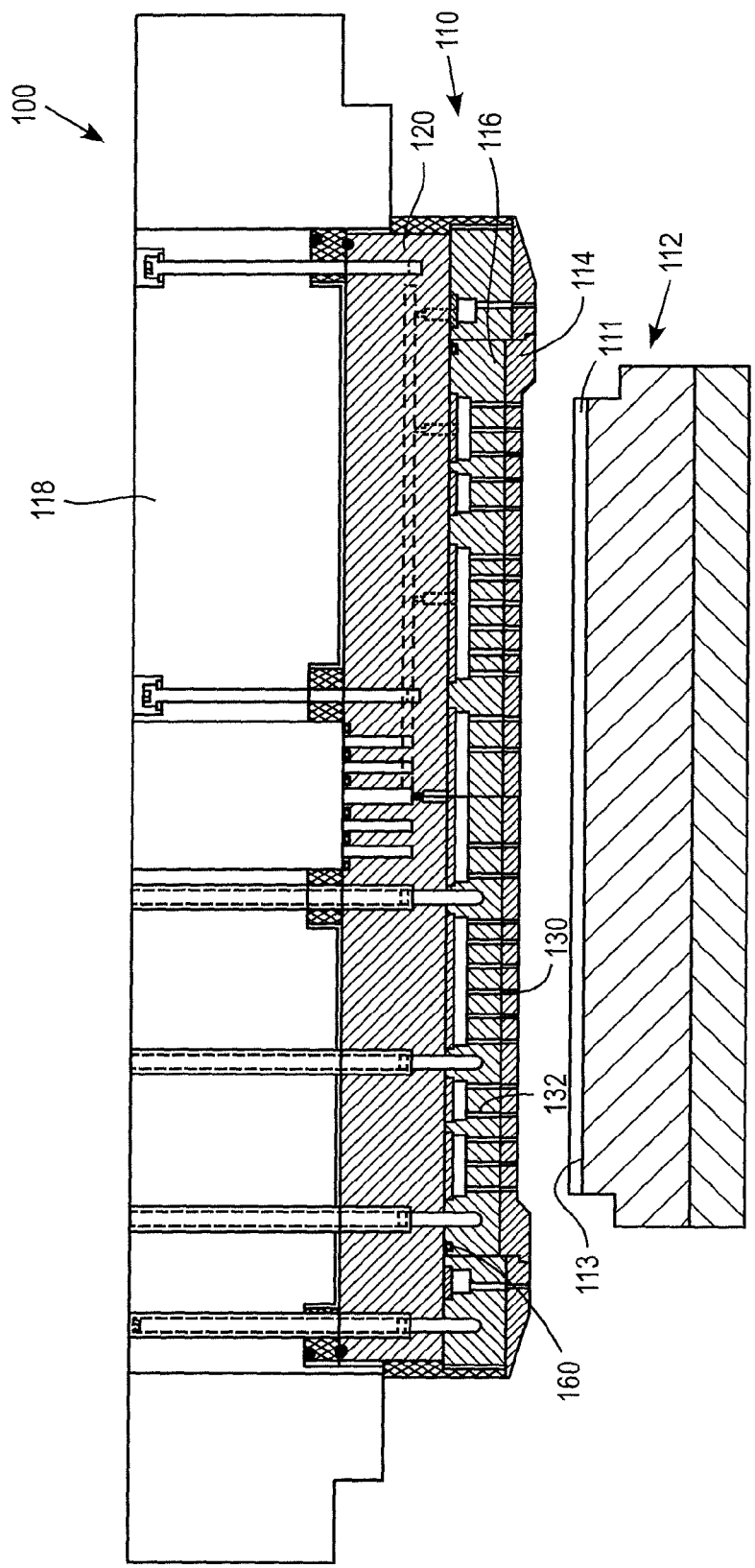
FIG. 1 shows a cross-sectional view of a plasma processing apparatus in accordance with an exemplary embodiment.

FIG. 1 illustrates a plasma processing chamber 100 in which semiconductor substrates, e.g., silicon wafers, are processed. The plasma processing chamber 100 includes a showerhead electrode assembly 110 and a lower electrode assembly 112 positioned below the showerhead electrode assembly 110 with a gap between the showerhead electrode assembly 110 and the lower electrode assembly 112 where plasma is generated. The showerhead electrode assembly 110 comprises a showerhead electrode (or top electrode) 114, an optional backing member 116 secured to the showerhead electrode 114, a top plate (or cooling plate) 118, and a heater plate 120 located between the showerhead electrode 114 and the optional backing member 116, and the top plate 118. A confinement ring assembly (not shown) surrounds the gap between the showerhead electrode 114 and lower electrode assembly 112. The lower electrode assembly 112 is configured to receive a semiconductor substrate 111.

The lower electrode assembly 112 preferably includes a bottom electrode and an optional electrostatic clamping electrode (ESC) for electrostatically clamping a substrate 111 subjected to plasma processing on an upper surface 113 of the lower electrode assembly 112.

In accordance with an exemplary embodiment, the showerhead electrode (or top electrode) 114 is preferably comprised of silicon, preferably single crystal silicon, and includes an inner electrode member and an outer electrode member, or electrode extension, surrounding the inner electrode member. The showerhead electrode 114 is a cylindrical plate for plasma processing of circular semiconductor substrates. The showerhead electrode 114 includes multiple gas passages 130 through which process gas is injected into the gap between the showerhead electrode 114 and lower electrode assembly 112. Plasma is generated in the gap by supplying RF power to the showerhead electrode 114 and/or lower electrode assembly 112.

The showerhead electrode (or top electrode) 114 and the backing member 116 can be bonded together, such as with an elastomeric material. The elastomeric material can be any suitable thermally and electrically conductive elastomeric material that can accommodate thermal stresses, and transfer thermal and electrical energy. As shown in FIG. 1, the top (or upper) surface of the showerhead electrode 114 is secured to the bottom (or lower) surface of the backing member 116 along a planar interface. The backing member 116 can include a backing plate secured to the top surface of the inner electrode member and backing ring surrounding the backing plate and secured to the top surface of the outer electrode member. The inner electrode member and outer electrode member are secured to the backing plate and backing ring, respectively, by a suitable bonding technique. The elastomeric material can accommodate thermal stresses, and transfer thermal and electrical energy between the bonded members of the showerhead electrode 114 and backing member 116. Suitable elastomeric bonding materials and techniques for joining the showerhead electrode 114 and the backing member 116 are disclosed in commonly-owned U.S. Pat. No. 6,073,577, which is incorporated herein by reference in its entirety.

The backing member 116 can be composed of various materials, which can include, e.g., aluminum (including aluminum and aluminum alloys, e.g., 6061 Al), graphite and silicon carbide. Aluminum backing plates can have a bare aluminum outer surface (i.e., a native oxide outer surface), or an anodized outer surface formed over all or only portions of the outer surface. Gas passages 132 in the backing member 116 are aligned with respective gas passages 130 in the showerhead electrode (or top electrode) 114 to supply process gas from the gas supply into the plasma processing chamber 100.

The top plate 118 can be made of aluminum, or the like. Optionally, the temperature of the top plate 118 is controlled by flowing a temperature-controlled liquid (e.g., water at a set temperature and flow rate) through liquid passages formed therein. For example, the temperature-controlled liquid flowing through liquid passages can be water or Flourinert. The top plate 118 can foam a removable top wall of the plasma processing chamber 100.

In accordance with an exemplary embodiment, the heater plate 120 is adapted to supply heat to the showerhead electrode 114 by thermal conduction through the backing member 116. The heater plate 120 can be a machined piece or casting of metal, such as aluminum, an aluminum alloy, or the like. The heater plate 120 can include one or more heaters operable to provide the desired heating capacity in the heater plate 120. During operation of the showerhead electrode assembly 110, the heater plate 120 is operable to supply a known amount of heat to the showerhead electrode 114, or sufficiently close to, the desired temperature, e.g., a temperature set point.

The showerhead electrode assembly 110 also preferably includes a temperature sensor arrangement 160 of one or more temperature sensors located, e.g., on the backing member 116. The respective temperature sensors can monitor the temperature at a respective portion of the showerhead electrode 114 and supply this temperature information to a temperature controller (not shown). The temperature controller controls the at least one power supply, which supplies power to one or more heating elements of the heater plate 120, which heats the showerhead electrode 114. The at least one power supply is controlled to supply power to the one or more heating elements based on the actual and desired temperature of the showerhead electrode 114.

Figure 2:
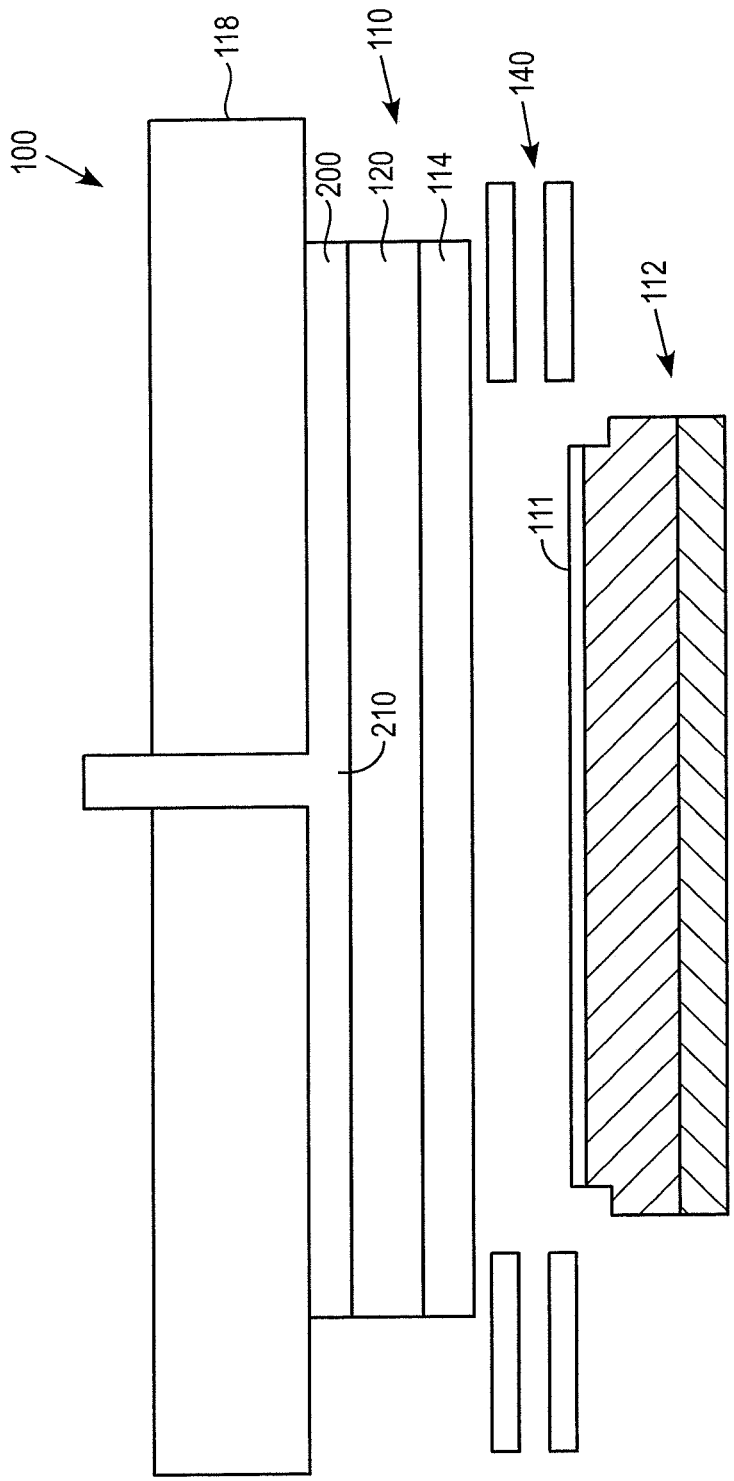
FIG. 2 shows a cross-sectional view of a plasma processing apparatus having a temperature control module in the form of a pressure controlled heat pipe in accordance with an exemplary embodiment.

FIG. 2 shows a cross-sectional view of an exemplary embodiment of a plasma processing chamber 100 having a temperature control module (or plate) 200, which is located between the top plate 118 and the heater plate 120. In accordance with an exemplary embodiment, the temperature control module 200 includes at least one pressure controlled heat pipe 210, which is in thermal contact with an upper surface of the heater plate 120 and a lower surface of the top plate 118. The at least one pressure controlled heat pipe 210 is preferable secured and/or attached to the top plate 118 and the heater plate 120 in any suitable manner, which maintains thermal contact with the top plate 118 and the heater plate 120. In accordance with an exemplary embodiment, the temperature control module or plate 200 includes at least one pressure controlled heat pipe 210, and more preferably a plurality of pressure controlled heat pipes 210. A confinement ring assembly 140 surrounds the gap between the showerhead electrode 114 and lower electrode assembly 112. Although, the exemplary embodiments are shown for a showerhead electrode assembly 110, the system and methods as described herein can also be implemented in a lower electrode assembly 112.

The at least one pressure controlled heat pipe 210 transfers heat between the top plate 118 and the heater plate 120. In accordance with an exemplary embodiment, during heating of the showerhead electrode (or top electrode) 114 by the heater plate 120, the at least one pressure controlled heat pipe 210 is configured to displace a heat transfer liquid (or condensing fluid) from a thermal path between the top plate 118 and the heater plate 120, and return the heat transfer liquid to the thermal path when removing excess heat from the showerhead electrode 114.

The at least one pressure controlled heat pipe 210 creates a variable conductance heat choke to the top plate 118, wherein the thermal conductance can be varied based on a variable internal pressure within the pressured controlled heat pipe 210. In accordance with an exemplary embodiment, the internal pressure of the pressure controlled heat pipe 210 can be increased or decreased based on the current temperature of the chamber process state as received from the temperature sensor arrangement 160. During preheating of the heater plate 120, the pressure within the at least one pressure controlled heat pipe 210 is increased to drive the transfer liquid (or working fluid) contained within the heat pipe 210 away from the cooled top plate 118, which thermally isolates the heater plate 120 from the cooled top plate 118. This allows the heater plate 120 to quickly heat the showerhead electrode 114 while transferring a minimal amount of energy to the top plate 118. In addition, by isolating (or decoupling) the top plate 118 from the heater plate 120 using the one or more pressure controlled heat pipes 210, a smaller heater can be used to preheat the showerhead electrode 114. The one or more pressure controlled heat pipes 210 can also maximize response time for the heater plate 120, which allows for faster response times for the heating and cooling of the showerhead electrode 114. In addition, during processing, the pressure within the at least one pressure controlled heat pipe 210 is preferably reduced to allow the thermal transfer fluid to come in contact with the cooled top plate 118, which thermally sinks the plasma heated showerhead electrode 114 to the cooling top plate 118.

Figure 3:
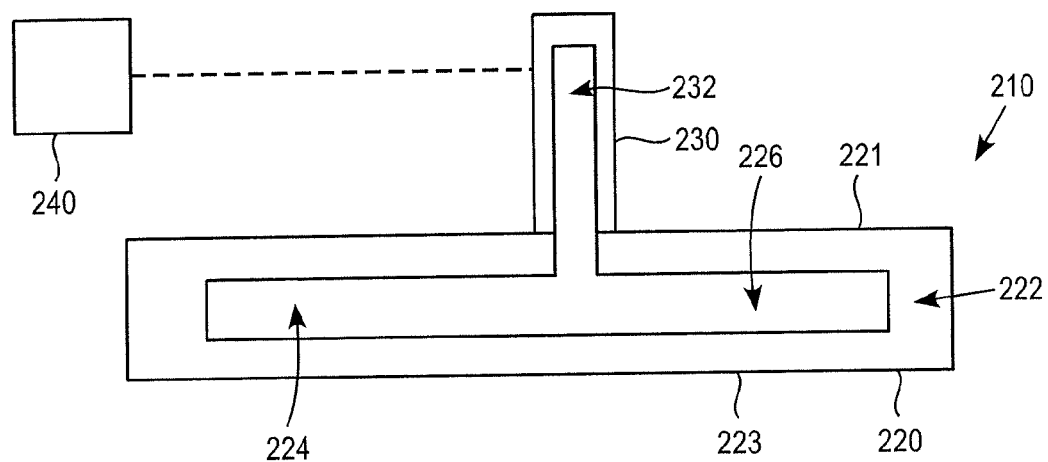
FIG. 3 shows a cross-sectional view of a pressure controlled heat pipe in accordance with an exemplary embodiment.

FIG. 3 is a cross-sectional view of a pressure controlled heat pipe 210. As shown in FIG. 3, the pressure controlled heat pipe 210 preferably includes a sealed tubular member 220 and a pressure control member 230, which extends from the tubular member 220. The tubular member 220 preferably has an annular cross-sectional shape. However, in accordance with an exemplary embodiment, the tubular member 220 can have a relatively flat upper surface 221 and a relatively flat lower surface 223, which are in thermal communication with the top plate 118 and the heater plate 120, respectively. The tubular member 220 can have a cross-sectional shape, which can include round, oval, rectangular, angular, and/or substantially flat.

The tubular member 220 preferably consists of a material with high thermal conductivity such as copper or aluminum. The tubular member 220 includes a heat transfer liquid (or working fluid) 222, and a vapor space 224, which is connected to the pressure control member 230. For example, the transfer liquid or working fluid 222 can include water, ethanol, liquid ammonia, methanol, acetone, sodium, or mercury. In accordance with an embodiment, the heat transfer liquid 220 is preferably water.

The pressure control member 230 also contains a control system 232, which preferably consists of a pressure transducer, a pressurized gas supply (i.e., helium supply), and a vacuum pump. A constant pressure within the pressure controlled heat pipe 210 can be maintained by admitting or removing the pressurized gas supply (i.e., helium) 226 from within the vapor space 224, or alternatively, depending on the function of the pressure controlled heat pipe 210 (i.e., heating or cooling), the pressure within the heat pipe 210 can be increased or decreased as needed. A series of pressure transducers and solenoid valves (not shown) are typically used, however, other suitable means can be used to control the pressure within the heat pipe.

In accordance with an exemplary embodiment, the power input to the pressure controlled heat pipe 210 is controlled by a temperature controller (not shown), which is coupled to the pressure control system 240. Data collection and commands are preferably performed by a computer (or controller), which monitors the temperature of the heater plate 120 and/or plasma processing chamber 100. A constant helium pressure translates into constant vapor pressure and temperature inside of the temperature controlled heat pipe 210.

In accordance with an exemplary embodiment, the at least one pressure controlled heat pipe 210 creates a variable conductance heat choke to the top plate 118. The thermal conductance of the pressure controlled heat pipe 210 can be varied by the variable internal pressure within the heat pipe 210, and wherein the internal pressure can be increased or decreased depending on the current chamber process state. For example, during preheating of the chamber 100, the pressure of the pressure controlled heat pipe 210 can be increased to drive the condensing fluid in the heat pipe away from the top plate 118.

Figure 4:
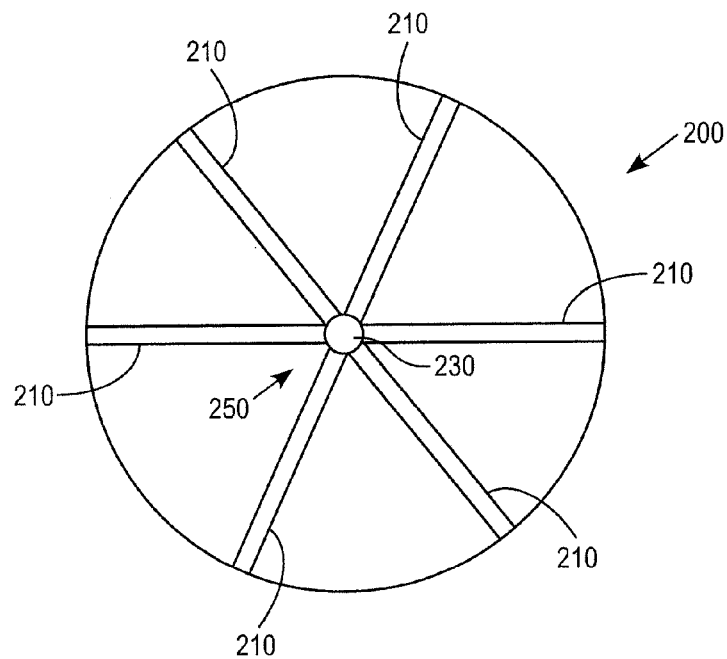
FIG. 4 shows a top view of a temperature control module, which include a plurality of pressure controlled heat pipes in accordance with an exemplary embodiment.

FIG. 4 shows a top view of a temperature control module or plate 200, which include a plurality of pressure controlled heat pipes 210 in accordance with an exemplary embodiment. As shown in FIG. 4, the temperature control module or plate 200 includes a plurality of pressure controlled heat pipes 210, each having an upper portion (or surface) 221 in thermal communication with the top plate 118 and a lower portion (or surface 223) in thermal communication with the heater plate 120. Each of the plurality of pressure controlled heat pipes 210 can extend outward from a center portion (or manifold) 250 of the thermal control module 200 in a radial configuration and/or any other configurations, which provides the needed temperature control and thermal conductance of the one or more pressure controlled heat pipes 210. In accordance with an exemplary embodiment, a centrally located manifold 250 is attached to one end of each of the plurality of pressure controlled heat pipes 210. The manifold 250 houses at least a portion of the pressure control member 230 for each of the one or more pressure control members 230. In accordance with an exemplary embodiment, the centrally located manifold 250 is a liquid cooled manifold.

Figure 5:
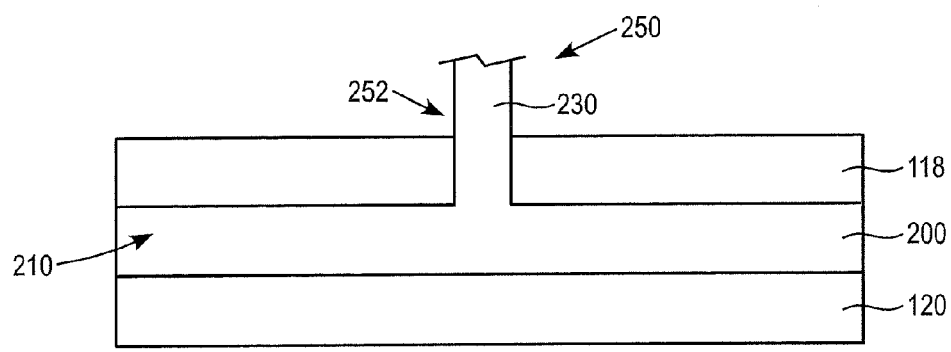
FIG. 5 shows a cross-sectional view of the temperature control module of FIG. 4, which include a plurality of pressure controlled heat pipes.

FIG. 5 shows a cross-sectional view of the temperature control module 200 of FIG. 4, which include a plurality of pressure controlled heat pipes 210. As shown in FIG. 5, a lower surface of the each of the plurality of pressure controlled heat pipes 210 is attached or fixed to an upper surface of the heater plate 120. In accordance with an exemplary embodiment, the centrally located manifold 250 extends upward through an opening 252 within the top plate 118.

In accordance with an exemplary embodiment, a method of controlling the temperature of a top electrode of a showerhead electrode assembly in a plasma processing chamber containing a substrate support having a bottom electrode, the method includes the steps of: generating plasma in the plasma processing chamber in a gap between the top electrode and the substrate support; applying power from at least one power supply to at least one heater of a heater plate of the showerhead electrode assembly to heat the top electrode; supplying a temperature-controlled liquid from at least one liquid source to liquid channels of a cooling plate of the showerhead assembly to control the temperature of the cooling plate; and controlling heat conduction between the cooling plate and the top plate by creating a variable conductance heat choke between the cooling plate and the heater plate by placing at least one pressure controlled heat pipe between the cooling plate and heater plate to thereby maintain the top electrode at a desired temperature, the at least one pressure controlled heat pipe having a heat transfer liquid contained therein, and a pressurized gas, which produces a variable internal pressure within the at least one pressure controlled heat pipe.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

What is claimed is:

1. A showerhead electrode assembly for a plasma processing chamber, comprising:
a showerhead electrode;
a heater plate secured to an upper surface of the showerhead electrode;
a temperature control plate secured to an upper surface of the heater plate, the temperature control plate comprising at least one pressure controlled heat pipe having a heat transfer liquid contained therein, and a pressurized gas, which produces a variable internal pressure within the at least one pressure controlled heat pipe;

a top plate secured to an upper surface of the temperature control plate;

a plurality of vertical aligned gas passages in the showerhead electrode, the heater plate, the temperature control plate, and the top plate for delivering a plasma processing gas to the plasma processing chamber located beneath a lower surface of the showerhead electrode; and wherein the variable internal pressure within the at least one pressure controlled heat pipe during heating of the showerhead electrode by the heater plate displaces the heat transfer liquid from a thermal path between the top plate and the heater plate, and when removing excess heat from the showerhead electrode returns the heat transfer liquid to the thermal path.

2. The assembly of claim 1, wherein the variable internal pressure within the at least one pressured controlled heat pipe is increased to displace the heat transfer liquid from a thermal path and decreased to return the heat transfer liquid to the thermal path.

3. The assembly of claim 1, wherein the at least one pressure controlled heat pipe comprises a sealed tubular member containing the heat transfer liquid and a pressure control member extending from the sealed tubular member.

4. The assembly of claim 2, further comprising a controller, which controls the variable internal pressure of the pressurized gas within the at least one pressure controlled heat pipe.

5. The assembly of claim 1, wherein the heat transfer liquid is water.

6. The assembly of claim 1, wherein the heater plate comprises a piece of a metal having heating elements embedded therein, the heating elements adapted to be connected to at least one power supply operable to supply power to the heating elements, and the top plate comprises a piece of a metal having liquid channels formed therein, the liquid channels are adapted to be in fluid communication with at least one source of a temperature-controlled liquid which is supplied to the liquid channels to control the temperature of the top plate.

7. The assembly of claim 1, wherein the showerhead electrode is a silicon electrode.

8. The assembly of claim 1, further comprising a plasma processing gas, which is supplied to the plurality of vertical gas passages in the showerhead electrode, the heater plate, the temperature control plate, and the top plate.

9. The assembly of claim 1, wherein the temperature control plate has a relatively flat upper surface and a relatively flat lower surface, and wherein the relatively flat upper and lower surfaces are in thermal communication with the top plate and the heater plate, respectively.

10. The assembly of claim 1, wherein the at least one pressure controlled heat pipe is a plurality of pressure controlled heat pipes, each of the plurality of pressure controlled heat pipes having an upper portion in thermal communication with the top plate and a lower portion in thermal communication with the heater plate.

11. The assembly of claim 10, further comprising a centrally located pressure manifold, which is attached to each of the plurality of pressure controlled heat pipes.

12. The assembly of claim 1, wherein at least a portion of the temperature control plate extends upward through the top plate.

13. A method of controlling the temperature of a top electrode of a showerhead electrode assembly in a plasma processing chamber containing a substrate support having a bottom electrode, the method comprising:

generating plasma in the plasma processing chamber in a gap between the top electrode and the substrate support;

applying power from at least one power supply to at least one heater of a heater plate of the showerhead electrode assembly to heat the top electrode; and controlling heat conduction between the heater plate and a top plate by creating a variable conductance heat choke between the heater plate and the top plate with a temperature control plate between the heater plate and top plate to thereby maintain the top electrode at a desired temperature, the temperature control plate comprising at least one pressure controlled heat pipe having a heat transfer liquid contained therein, and a pressurized gas, which produces a variable internal pressure within the at least one pressure controlled heat pipe.

14. The method of claim 13, wherein the at least one pressure controlled heat pipe displaces the heat transfer liquid from a thermal path between the top plate and the heater plate during heating of the top electrode by the heater plate, and returns the heat transfer liquid to the thermal path when removing excess heat from the top electrode.

15. The method of claim 14, further comprising:

increasing the variable internal pressure within the at least one pressure controlled heat pipe to displace the heat transfer liquid from a thermal path and decreasing the variable internal pressure to return the heat transfer liquid to the thermal path.

16. The method of claim 14, wherein the temperature control plate has a relatively flat upper surface and a relatively flat lower surface, and wherein the relatively flat upper and lower surfaces are in thermal communication with the top plate and the heater plate, respectively.

17. The method of claim 14, wherein the at least one pressure controlled heat pipe is a plurality of pressure controlled heat pipes, each of the plurality of pressure controlled heat pipes having an upper portion in thermal communication with the top plate and a lower portion in thermal communication with the heater plate.

18. The assembly of claim 10, wherein the plurality of pressure controlled heat pipes extend outward from a central manifold in a radial configuration.

19. The assembly of claim 18, wherein the central manifold is a liquid cooled manifold.

20. The method of claim 14, comprising:

supplying the plasma processing gas to the plasma processing chamber via a plurality of vertical aligned gas passages in the showerhead electrode, the heater plate, the temperature control plate, and the top plate.

* * * * *